United States Patent [19]
Kunst et al.

[11] Patent Number: 5,442,320
[45] Date of Patent: Aug. 15, 1995

[54] MIRROR AND BIAS CIRCUIT FOR CLASS AB OUTPUT STAGE WITH LARGE SWING AND OUTPUT DRIVE

[75] Inventors: David J. Kunst; Stuart B. Shacter, both of Tucson, Ariz.

[73] Assignee: National Semiconductor Corporation, Santa Clara, Calif.

[21] Appl. No.: 257,587

[22] Filed: Jun. 9, 1994

[51] Int. Cl.$^6$ .............................................. H03F 3/30
[52] U.S. Cl. ...................................... 330/267; 330/255
[58] Field of Search ................. 330/255, 263, 266, 267, 330/268

[56] References Cited

U.S. PATENT DOCUMENTS

| | | | |
|---|---|---|---|
| 4,570,128 | 2/1986 | Monticelli | 330/267 |
| 5,049,653 | 9/1991 | Smith et al. | 330/267 |
| 5,140,280 | 8/1992 | Vyne et al. | 330/255 |

OTHER PUBLICATIONS

Robert L. Vyne, Thomas D. Petty, Rikki Koda, and David M. Susak; A Quad Low Voltage Rail-To-Rail Operational Amplifier; IEEE 1992 Bipolar Circuits and Technology Meeting; pp. 242-245.

Primary Examiner—James B. Mullins
Attorney, Agent, or Firm—H. Donald Nelson; Ken John Koestner; Vince Pitruzzella

[57] ABSTRACT

A complementary transistor class AB output stage (200) utilizes a complementary pair of output drivers (220, 222) connected in series between the power supply rails (210, 216) to furnish the stage output. An output driver (206) is a composite pair of transistors in a Darlington configuration, which boosts the current gain and input resistance of the output stage. Bases of the output drivers are connected by a complementary pair of parallel connected drivers (226, 228), which function as common base level shifters. Quiescent bias of the output drivers is achieved by a pair of constant current transistors (232, 238) that are operated as complementary current mirrors. Inputs to the mirrors are relatively low current sink (252) and source (250) supplies. A level shifter and its corresponding current mirror are configured so that base currents flowing therein, which may be variable due to temperature and process variations, are generally shunted away from the current mirrors and toward an output driver to maintain mirrored currents and assist output drive.

37 Claims, 8 Drawing Sheets

MIRROR AND BIAS CIRCUIT FOR CLASS AB OUTPUT STAGE WITH LARGE SWING AND OUTPUT DRIVE

BACKGROUND OF THE INVENTION

1. Field of the Invention

The present invention relates to a class AB amplifier output stage and, more particularly, to a current mirror and output driver for such an output stage.

2. Description of the Related Art

An output stage of an amplifier must satisfy many performance specifications, such as delivering a specified signal power to a load while maintaining a low signal distortion. It is also desired that the output stage limit output impedance so that voltage gain does not vary greatly when the load impedance changes. The output stage should consume low quiescent power and must not greatly limit the frequency response of the amplifier.

FIG. 1 illustrates a schematic circuit diagram of an output stage of an operational amplifier (op-amp) in accordance with U.S. Pat. No. 4,570,128 (Monticelli D. M.) "Class AB Output Circuit with Large Swing," issued on Feb. 11, 1986. Current source 150 causes current $i_1$ flow in transistors 136 and 138. Current source 152 causes current $i_2$ flow in transistors 132 and 134. Transistors are configured as a current mirror so that quiescent current flow in transistor 122 is defined by current flowing in the circuit formed by transistors 128, 130, 136 and 138. A similar configuration of transistors as a current mirror is furnished by transistors 124, 126, 132 and 134 to define the current flowing in output transistor 120. These transistors are configured so that the current through mirrored transistors is set by emitter area ratios and current densities in the emitters, so that the bias or quiescent currents are relatively stable over variable temperature and process conditions. Assuming that the base current of the transistors is negligible, transistor 138 drives a desired current $i_6$ flow in transistor 130. Current $i_6$ is partially supplied from each of current $i_7$ flow in transistor 140, current $i_4$ flow in transistor 126 and current $i_5$ flow in transistor 128. Current $i_5$ and $i_6$ are supplied from current $i_3$ flow in transistor 124, which is a mirror driven by transistor 132 current $i_2$ flow. By virtue of the current mirrors, all currents are predetermined so that the currents $i_8$ and $i_9$ are equal and quiescent current at terminal 114 is negligible.

However, the assumption of negligible base current is greatly optimistic when temperature, operating frequency and process variations of the transistors are considered, particularly in the case of pnp transistors. Bipolar pnp devices are generally inferior to npn devices in frequency response and high-current behavior. Current gain $\beta_F$ is assumed to remain constant during operation of a circuit. However, $\beta_F$ does vary with operating conditions. For example, increasing the value of $V_{CE}$ increases $I_C$ while there is little change in $I_B$. Therefore, the effective $\beta_F$ increases. Also, $\beta_F$ varies both with temperature and transistor collector current. Variations with operating conditions cause greater changes in $\beta_F$ for pnp transistors than for npn transistors. Parameters of a transistor, particularly $\beta_F$, are subject to process variation.

In the actual case, current flows from the base of transistor 124 and the base of transistor 126, reducing the current $i_2$ flow in transistor 132. The mirrored current $i_3$ flow in transistor 124 is thus reduced. Since the sum of currents $i_3$ and $i_7$ drive output transistor 122, a reduction in current $i_3$ places a greater demand on emitter follower 140 to drive the output of the output stage 100. In addition, over temperature and process variations this base current can change dramatically and the change in the base current alters the bias current $i_7$ flow in transistor 140. Thus the temperature and process variations reflect directly back to the input stage of the op-amp as an offset error.

SUMMARY OF THE INVENTION

What is desired is an improved output stage that maintains proper bias relationships in output stage transistors. What is further desired is an output stage that reduces offset errors in the input stage and improves the output current drive of the op-amp.

These and other advantages are attained by an output stage, in accordance with the present invention, which utilizes a complementary pair of output drivers connected in series between the power supply rails with their collectors furnishing the stage output. At least one of the output drivers is a composite pair of transistors in a Darlington configuration that boosts the current gain and input resistance of the output stage. The bases of the output drivers are connected by a complementary pair of parallel connected drivers, which function as common base level shifters. Quiescent bias of the output drivers is achieved by a pair of constant current transistors that are operated as complementary current mirrors. Inputs to the mirrors are relatively low current source and sink supplies. A level shifter and its corresponding current mirror are configured so that base currents flowing therein, which may be variable due to temperature and process variations, are generally shunted away from the current mirrors and toward an output driver. Thus mirrored currents are generally maintained and output drive is assisted in response to increases in base current.

DESCRIPTION OF THE PREFERRED EMBODIMENTS

Figure 1:
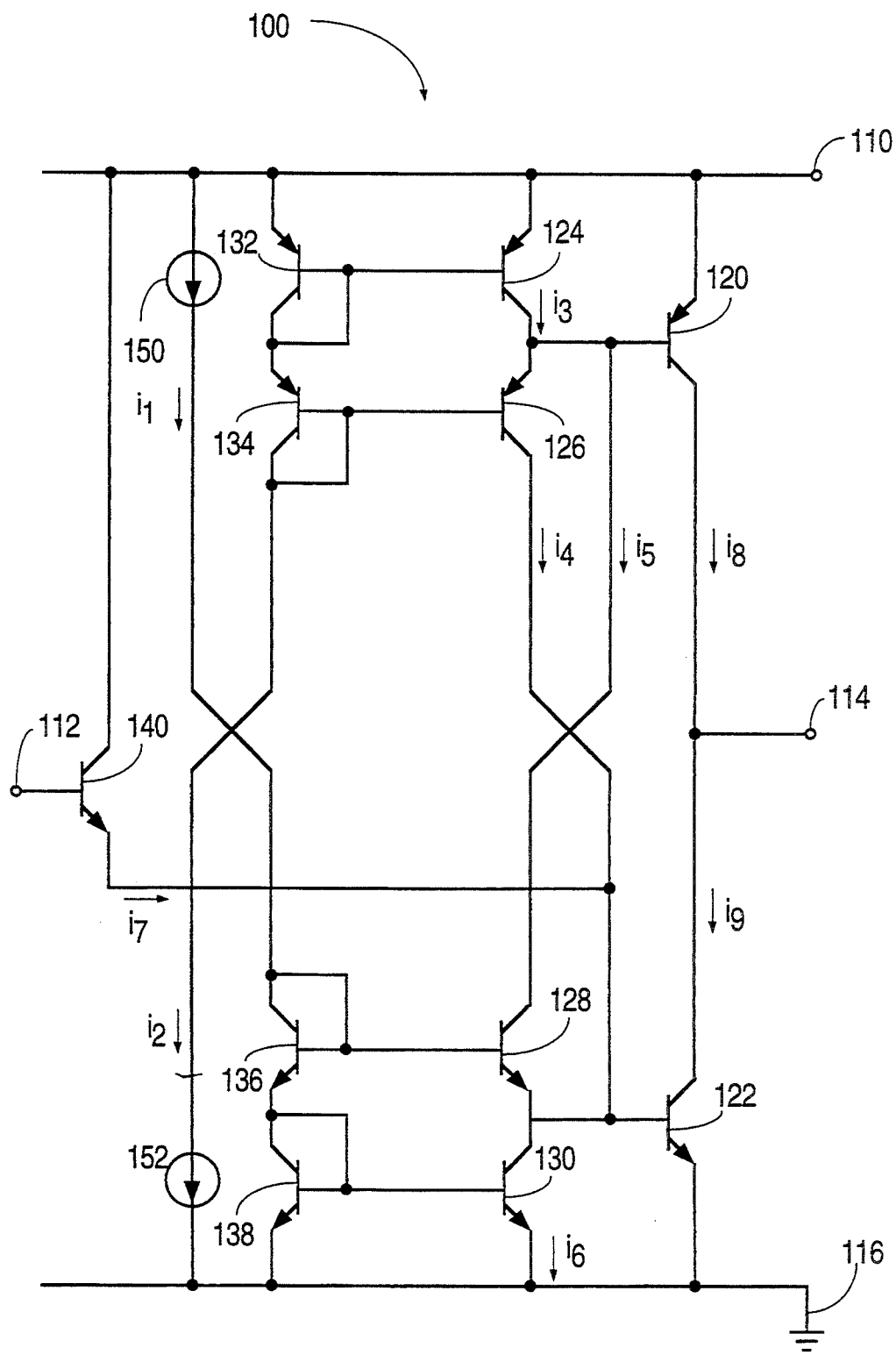
FIG. 1 is a bipolar transistor schematic circuit diagram of a conventional class AB output stage with a large voltage swing.
Figure 2:
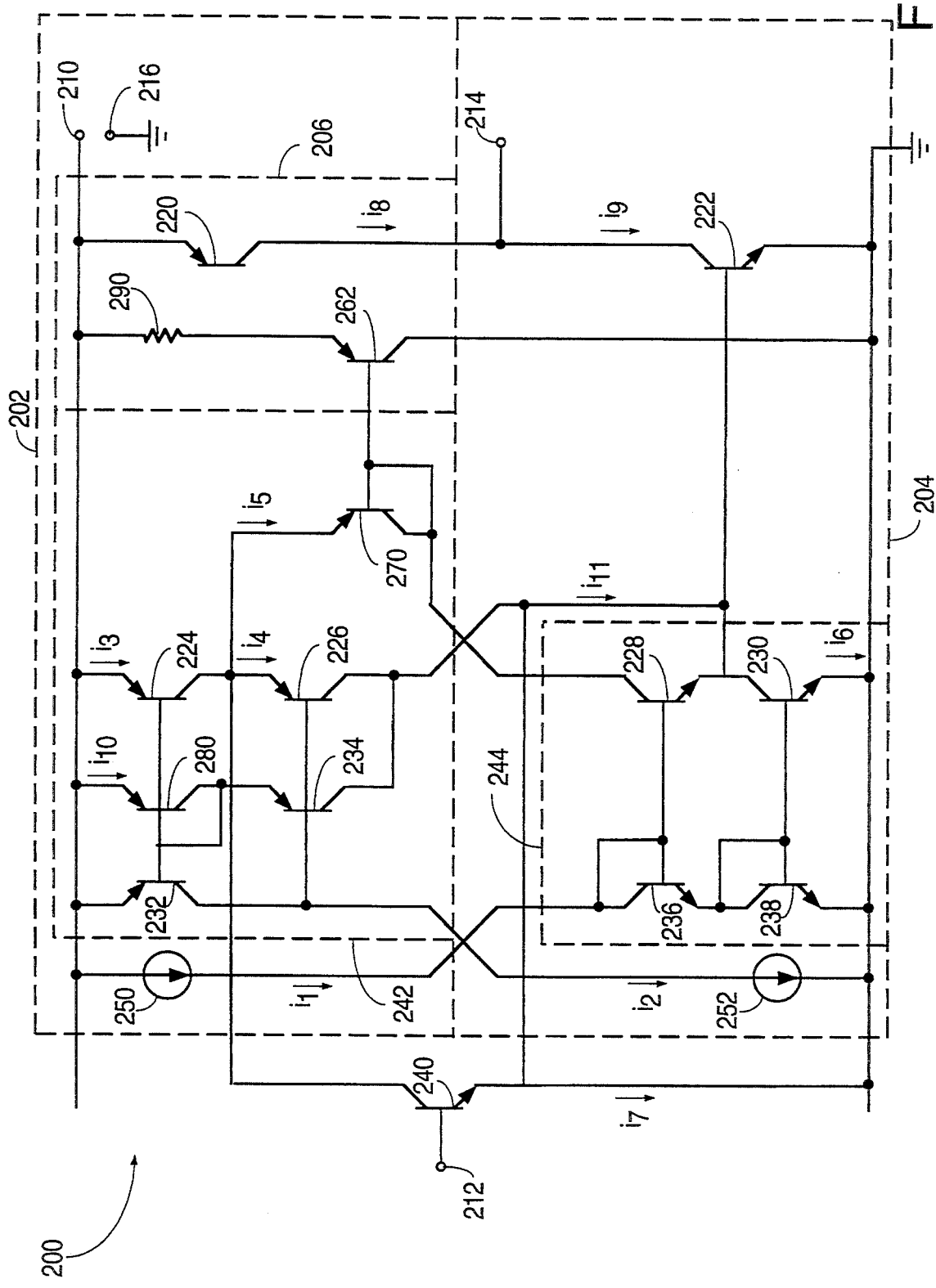
FIG. 2 is a bipolar transistor schematic circuit diagram of a class AB output stage utilizing an improved mirror circuit and a Darlington output driver for one of the complementary outputs.

Referring to FIG. 2, the amplifier output stage 200 is powered from a power supply (not shown) having a positive voltage connection to a power supply positive terminal 210 and having a negative voltage connection to ground 216. Output stage 200 furnishes an output signal at an output terminal 214 in response to input signals applied to an input terminal 212, which is connected to a pnp driver transistor 240. Output stage 200 is a push-pull output stage in which a positive drive circuit 202, including a pnp output transistor 220, draws the voltage at output terminal 214 toward the voltage at power supply positive terminal 210, while a negative drive circuit 204 including an npn output transistor 222 draws the output terminal 214 voltage toward ground 216. The pnp output transistor 220 and the npn output transistor 222 are connected in series.

Positive drive circuit 202 includes a positive Darlington driver 206 which incorporates the pnp output transistor 220, a pnp current boost transistor 262 and a bias resistor 290. Positive drive circuit 202 also includes a positive current mirror circuit 242 which incorporates a pnp constant current source transistor 224, a pnp common base bias transistor 226, a pnp current mirror transistor 232, a pnp transistor 234 and a pnp diode drop transistor 280. In addition, positive drive circuit 202 includes a pnp diode level shift transistor 270. In positive Darlington driver 206, pnp output transistor 220 has an emitter connected to power supply positive terminal 210, a collector connected to the output terminal 214 and a base. Pnp current boost transistor 262 has an emitter connected to the base of pnp output transistor 220, a collector connected to ground 216 and a base. Bias resistor 290 is connected between power supply positive terminal 210 and a junction between the base of pnp output transistor 220 and the emitter of pnp current boost transistor 262.

In general, a Darlington driver is a three terminal composite transistor that is used in place of a single transistor in common-emitter, common-base and common-collector configurations. In the output stage depicted in FIG. 2, the Darlington configuration is a composite two-transistor device (transistors 262 and 220), in which the emitter of the first device (262) drives the base of the second (220). The additional transistor (262) is incorporated into the Darlington configuration to boost the current gain and input resistance of the basic bipolar transistor. A biasing element of some sort (bias resistor 290) is required to control the emitter current of the pnp current boost transistor 262, which is configured as an emitter follower. In a Darlington configuration circuit, the biasing element (290) furnishes a current source, which is present to establish the quiescent dc operating current in the emitter-follower transistor (262). In some Darlington configurations, such as the configurations depicted in FIGS. 4 and 5, the biasing element is a transistor. In other embodiments, the current source is not used. In further Darlington configurations, such as the configurations illustrated in FIGS. 2 and 3, the current source is replaced by a resistor. A resistor having a resistance R is used, rather than a transistor, as a bias element when the bias current is $V_{BE}/R$ so that a diode voltage drop $V_{BE}$ is the same as that attained using a transistor bias element. A resistor bias element furnishes a less complicated circuit and improved performance since the bias current of a resistor does not change with temperature or process variations in the manner of a transistor, particularly a pnp transistor. For example, when output stage 200 sinks a large current, pnp output transistor 220 turns off and its $V_{BE}$ goes to zero. A transistor as the Darlington bias element would saturate, degrading the performance of positive current mirror circuit 242 and output stage 200.

In positive current mirror circuit 242, pnp constant current source transistor 224 has an emitter connected to power supply positive terminal 210, a collector and a base. Pnp common base bias transistor 226 is connected in series with pnp constant current source transistor 224 and has an emitter connected to the collector of pnp constant current source transistor 224, a collector and a base connected to a bias current sink 252. Pnp current mirror transistor 232 has an emitter connected to power supply positive terminal 210, a collector connected to a junction between the base of pnp common base bias transistor 226 and bias current sink 252 and a base connected to the base of pnp constant current source transistor 224. Constant current source transistor 224 forms a current mirror with the pnp current mirror transistor 232 and this current mirror also forms a current mirror with pnp output transistor 220. Pnp diode drop transistor 280 has an emitter connected to power supply positive terminal 210, a collector and a base which is connected to the bases of pnp constant current source transistor 224 and pnp current mirror transistor 232. In addition, the collector and base of pnp diode drop transistor 280 are interconnected. Pnp transistor 234 is connected in series with pnp diode drop transistor 280 and has an emitter connected to the collector of pnp diode drop transistor 280, a collector connected to the collector of pnp common base bias transistor 226 and a base connected to a junction between the base of pnp common base bias transistor 226 and bias current sink 252. The series connection of pnp diode drop transistor 280 and pnp transistor 234 develop a potential about two $V_{BE}$ below the voltage of power supply positive terminal 210 to furnish a source of bias voltage to the base of the Darlington driver 206.

Pnp diode level shift transistor 270 has an emitter connected to a junction between the collector of pnp constant current source transistor 224 and the emitter of pnp common base bias transistor 226 and a collector and base which are interconnected and connected to the base of pnp current boost transistor 262. The pnp diode level shift transistor 270 is furnished to match the dc level of the input to the Darlington driver 206 to its connection to the positive mirror circuit 242. Level shift transistor 270 is configured as a diode, which provides a unity-voltage-gain level shift since the dc voltage at the output is shifted by $V_{BE(on)}$.

Figure 4:
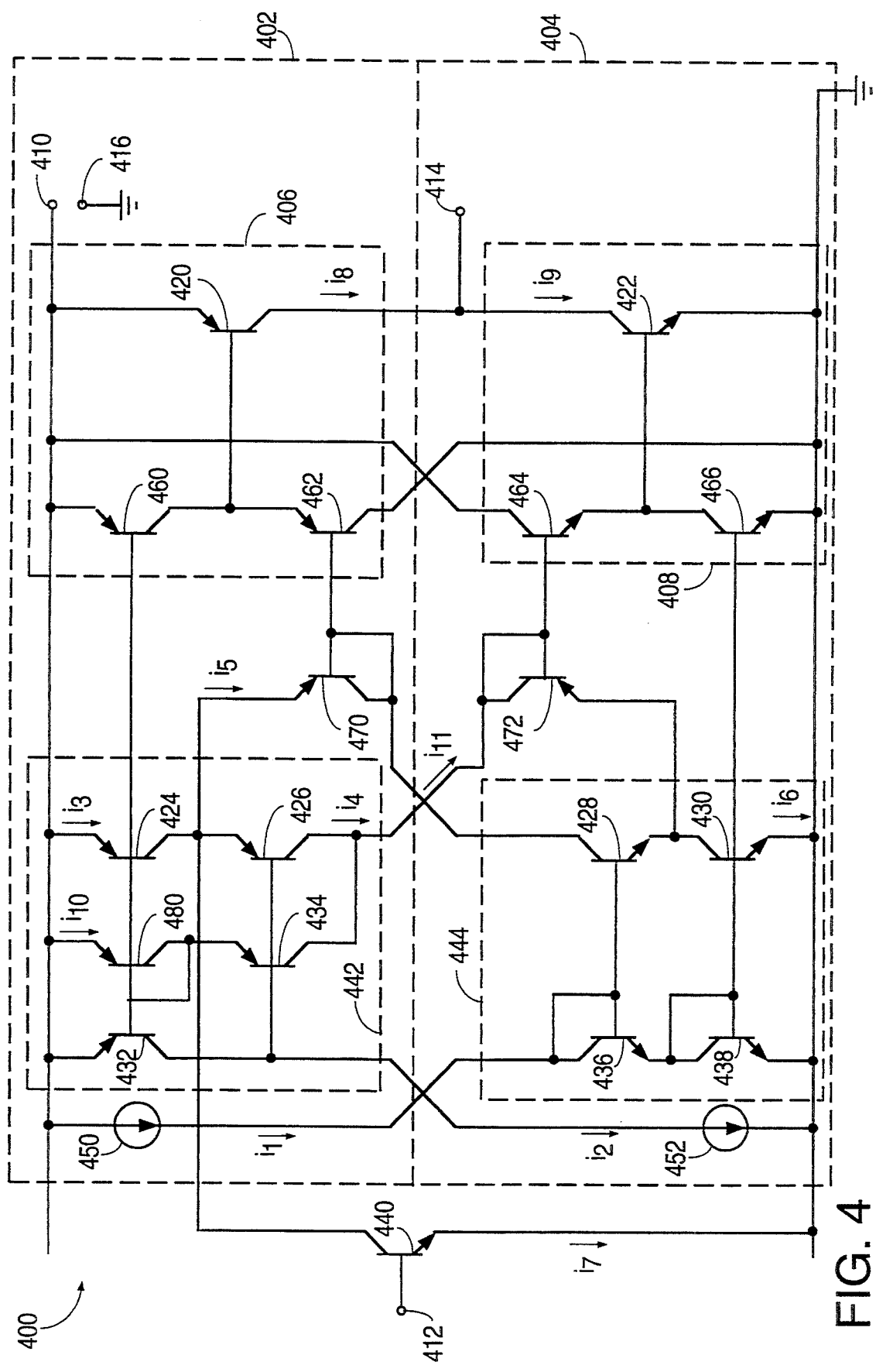
FIG. 4 is a bipolar transistor schematic circuit diagram of a class AB output stage having an improved mirror circuit and Darlington output drivers utilizing a transistor as a bias element.
Figure 5:
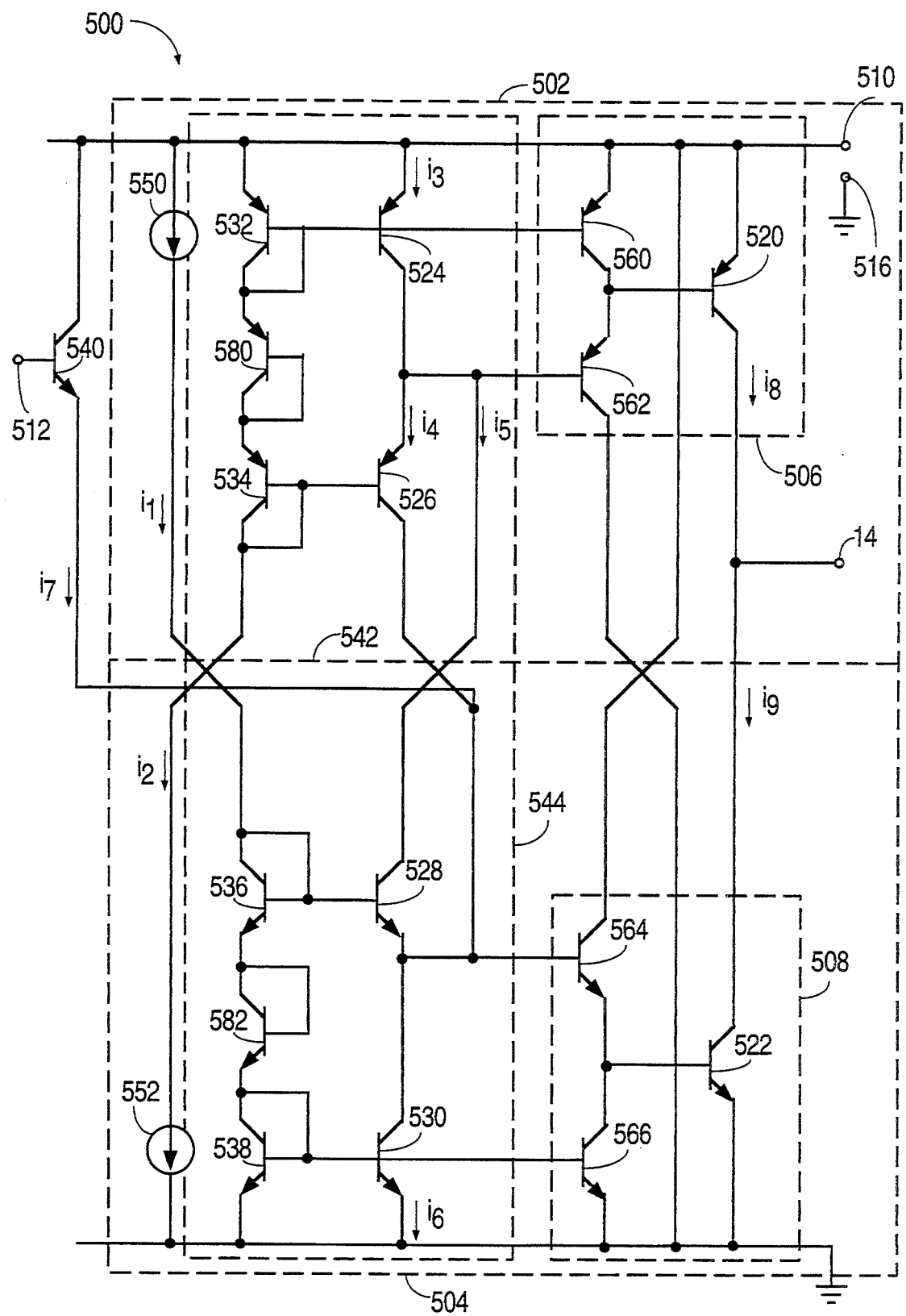
FIG. 5 is a bipolar transistor schematic circuit diagram of a class AB output stage utilizing Darlington output drivers for both complementary outputs.

Other level shift configurations are possible, such as the configuration depicted in FIG. 5. The level shift configurations of FIGS. 2, 3 and 4 employ of minimum power supply voltage of $3V_{BE}+V_{CE(SAT)}$. The level shift configuration of FIG. 5 utilizes a minimum power supply voltage of $4V_{BE}+V_{CE(SAT)}$.

Pnp driver transistor 240, which is configured as an emitter follower, has a collector connected to ground 216, an emitter connected to the junction between the collector of pnp constant current source transistor 224 and the emitter of pnp common base bias transistor 226, and a base connected to input terminal 212. In alternative embodiments, such as the embodiment depicted in FIG. 5, the input driver is an npn driver transistor which is connected to drive the base of the npn output driver.

Negative drive circuit 204 includes npn output transistor 222 and a negative current mirror circuit 244 which incorporates an npn current sink transistor 230, an npn common base bias transistor 228, an npn current mirror transistor 238 and an npn transistor 236. In negative current mirror circuit 244, npn current sink transistor 230 has an emitter connected to ground 216, a collector and a base. Npn common base bias transistor 228 is connected in series with npn current sink transistor 230 and has an emitter connected to the collector of npn current sink transistor 230, a collector connected to the interconnected collector and base of pnp diode level shift transistor 270, and a base. Npn current mirror transistor 238 has an emitter connected to ground 216 and a collector and base which are interconnected and also connected to the base of npn current sink transistor 230. Npn current sink transistor 230 forms a current mirror with the npn current mirror transistor 238 and this current mirror also forms a current mirror with npn output transistor 222. Npn transistor 236 is connected in series with npn current mirror transistor 238 and has an emitter connected to the collector of npn current mirror transistor 238 and a collector and base that are interconnected and also connected to the base of npn common base bias transistor 228 and to a bias current source 250. The series connection of npn current mirror transistor 238 and npn transistor 236 to develop a potential about two $V_{BE}$ above ground 216 to supply a source of bias voltage to the base of the npn output transistor 222. Npn output transistor 222 has an emitter connected to ground 216, a collector connected to the output terminal 214 and a base connected to the junction between the emitter of npn common base bias transistor 228 and the collector of npn current sink transistor 230.

The output stage depicted in FIG. 2 includes only a single Darlington driver 206, which is configured to operate in the pnp portion of the circuit. This embodiment is most useful for single power supply op-amps since such amplifiers nearly always source current and rarely sink current.

When it is assumed that the base current is negligible in positive current mirror circuit 242, bias current source 250 causes $i_1$ current flow through the series connection of npn current mirror transistor 238 and npn transistor 236. Similarly, bias current sink 252 causes $i_2$ current flow through pnp current mirror transistor 232. Pnp constant current source transistor 224 supplies a constant current source, part of which is conducted from power supply positive terminal 210 to the base of npn output transistor 222. The current source of pnp constant current source transistor 224 conducts current $i_3$, which is divided into three parts. Two parts of current $i_3$ flow in complementary transistors: pnp common base bias transistor 226, which carries current $i_4$, and npn common base bias transistor 228 bearing current $i_5$ via pnp diode level shift transistor 270. The third part of current $i_3$ flows through pnp driver transistor 240 as current $i_7$. Thus, current $i_3$ is the sum of currents $i_4$, $i_5$ and $i_7$. Pnp transistor 234 and pnp diode drop transistor 280 conduct current $i_{10}$ from power supply positive terminal 210 to the collector of pnp common base bias transistor 226. Current $i_4$, current $i_5$ and current $i_{10}$ are summed and conducted in npn current sink transistor 230 as current $i_6$.

The emitter areas of pnp transistors 224 and 232 are made different, causing the respective transistor collector currents $i_2$ and $i_3$ to be different, but having a substantially constant ratio. Also, the collector current $i_8$ of pnp output transistor 220 mirrors the current in pnp constant current source transistor 224, $i_3$. The ratios of currents flowing within positive drive circuit 202 are thus controlled so that current $i_8$ is a ratio of current $i_3$, which is, in turn, a ratio of current $i_2$.

Similarly, npn transistors 230 and 238 are ratioed so that respective transistor collector currents $i_1$ and $i_6$ have a substantially constant ratio. Collector current $i_9$ through npn output transistor 222 mirrors the current in npn current sink transistor 230, $i_6$. The ratios of currents flowing within negative drive circuit 204 are thus controlled so that current $i_9$ is a ratio of current $i_6$, which is, in turn, a ratio of current $i_1$. Accordingly, the quiescent value of currents $i_8$ and $i_9$ are controlled as a function of differences in the geometric ratios of transistor emitter areas.

The collector current $i_7$ of pnp driver transistor 240 is supplied by constant current source transistor 224 and is equal to the difference between currents $i_3$ and $i_6$. When the base potential of pnp driver transistor 240 is decreased, or driven closer to ground 216, its emitter potential follows. Since the base of pnp common base bias transistor 226 is held at a constant potential, approximately $2V_{BE}$ below power supply positive terminal 210, its emitter-base potential and thus current $i_4$ decrease. However, npn current sink transistor 230 demands the same collector current $i_6$, and thus forces npn common base bias transistor 228 to sink more current. Therefore, current $i_5$ increases by the same amount that current $i_4$ decreases. When npn common base bias transistor 228 sinks more collector current, it pulls down the base of Darlington output driver 206. This turns the Darlington driver 206 on harder and the output at signal output terminal 214 sources more current $i_8$ into a load connected between signal output terminal 214 and ground 216. The increased current in npn common base bias transistor 228 causes an increase in its base-emitter potential. Since the base potential of npn common base bias transistor 228 is held at a constant bias reference potential of approximately $2V_{BE}$ above ground 216, the base-emitter potential of npn output transistor 222 decreases and its collector current $i_9$ also declines.

Alternatively, as the input signal at terminal 212 is increased, driven closer to the potential at power supply positive terminal 210, the potential of the emitter follower of pnp driver transistor 240 follows. Since the base potential of pnp common base bias transistor 226 is held constant, its emitter-base potential and thus current $i_4$ increase. Current $i_6$ remains constant so that current $i_5$ decreases by the same amount that current $i_4$ increases. As a result, the base potential of Darlington output driver 206 is pulled closer to the potential at power supply positive terminal 210, which has the effect of decreasing the output current $i_8$. When pnp common base bias transistor 226 sources more current, it pulls the base of npn output transistor 222 up. This turns npn output transistor 222 on harder and the output at signal output terminal 214 sinks more current from a load.

This analysis assumes that transistor beta ($\beta$) is infinite. In practice, effects of $\beta$ influence the operation of the output stage 200. When the output stage 200 sources current from signal output terminal 214 into a load (not shown), current $i_8$ increases in the described manner. Therefore, part of current $i_6$ flowing in the collector of npn constant current source transistor 230 is supplied by the base current of pnp current boost transistor 262. This base current increases by an amount equal to the increase in current $i_8$ divided by $\beta_{PNP}^2$. Likewise, when output stage 200 sinks large currents from a load connected to signal output terminal 214, part of current $i_3$ is consumed by the required base current of npn output transistor 222. In either case, the result is that the collector current $i_7$ in pnp driver transistor 240 is modulated to account for the change in output driver base current. More specifically, for output sourcing current, current $i_7$ increases by an amount equal to the base current in pnp current boost transistor 262. For output sinking current, current $i_7$ decreases by an amount equal to the base current in npn output transistor 222. The change in current $i_7$ is divided by $\beta$ of pnp driver transistor 240 and appears at signal input terminal 212. As a result, the input bias current flowing at signal input terminal 212 changes when the output load sinks and sources current. This error can manifest itself as a degradation in open loop voltage gain of the amplifier. Darlington output driver 206 is thus incorporated to improve the performance of output stage 200.

For negligible signals applied to signal input terminal 212, dimensions of series-connected pnp output transistor 220 and npn output transistor 222 are scaled so that their gains are substantially equal and the respective quiescent current flows $i_8$ and $i_9$ are substantially equal.

The effects of transistor beta ($\beta$) variations due to temperature and process irregularities are reduced by the mirror configuration of npn transistors 242, 226, 232, 234 and 280. In this configuration only a single pnp transistor, pnp current mirror transistor 232, lies in the current flow path $i_2$ from positive power supply terminal 210 to ground 216 and its current, along with the base current of transistors 234 and 226, supplies the current required by current sink 252. The base current of npn current mirror transistor 232, pnp transistor 280 and npn current source transistor 224 flows through pnp transistor 234. The error current that is supplied to current sink 252 is this base current divided by the $\beta$ of pnp transistor 234. In this manner, the base current error of the entire mirror circuit is improved by a factor of $\beta_{pnp}$. Since the error current to current sink 252 is small due to this mirror configuration, the current that flows in pnp mirror transistor 232 is always roughly equal to the current flowing in the current sink 252. Since the current in pnp current source transistor 224 is dependent on the current in pnp mirror transistor 232, this current $i_3$ remains unaffected by variations in base current due to $\beta$. If the base current of transistors 224, 232 and 280 were applied directly, as current error, to current sink 252, then the current available to pnp current mirror transistor 232 would be substantially reduced, resulting in reduced current flow $i_3$ in pnp current source transistor 224. Two detrimental effects would result. First, current $i_7$ flowing in the emitter follower of pnp driver transistor 240 would reflect back to the input stage of the amplifier as an input offset voltage error. Second, the drive current to npn output transistor 222 would be reduced. The current mirror depicted in FIG. 2 provides that the current $i_{10}$ flowing through pnp transistor 234 is summed with current $i_4$ flowing in pnp common base bias transistor 226. The summed currents $i_4$ and $i_{10}$ is thus available to drive npn output transistor 222 and the current in the emitter follower of pnp driver transistor 240 is not reduced due to variations in $\beta$ so that offset errors are largely avoided.

Figure 3:
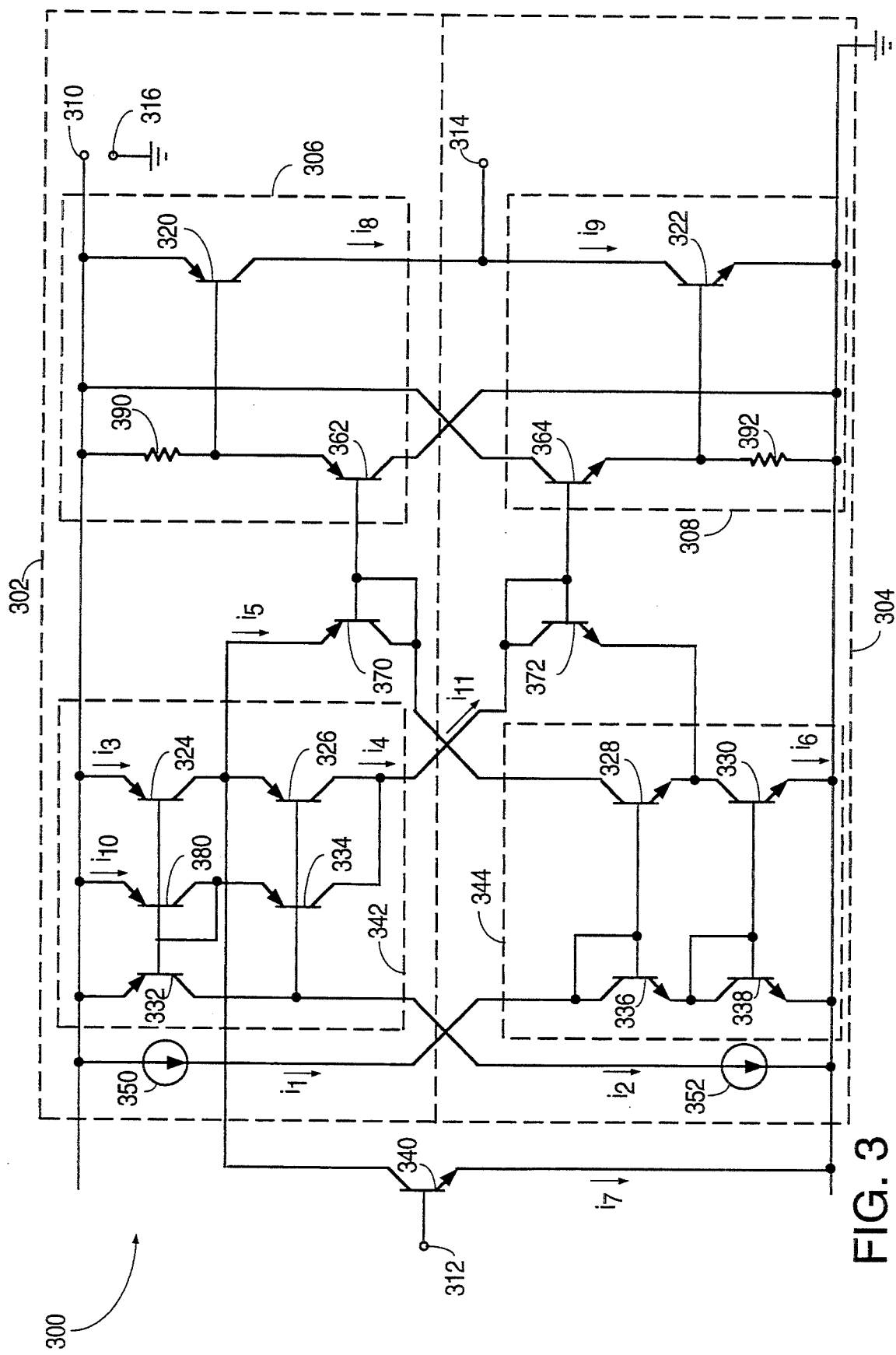
FIG. 3 is a bipolar transistor schematic circuit diagram of a class AB output stage utilizing an improved mirror circuit and Darlington output drivers for both complementary outputs.

FIG. 3 depicts an alternative embodiment of an amplifier output stage 300 which is comparable to amplifier output stage 200 shown in FIG. 2. Respective substantially equivalent components of amplifier output stages 300 and 200 include respective power supply positive terminals 310 and 210, grounds 316 and 216, input terminals 312 and 212, output terminals 314 and 214, pnp driver transistors 340 and 240, bias current sources 350 and 250 and bias current sinks 352 and 252. Positive drive circuit 302 and positive drive circuit 202 correspond and have substantially equivalent components including respective positive Darlington drivers 306 and 206, pnp output transistors 320 and 220, pnp current boost transistors 362 and 262, bias resistors 390 and 290, positive current mirror circuits 342 and 242, pnp constant current source transistors 324 and 224, pnp common base bias transistors 326 and 226, pnp current mirror transistors 332 and 232, pnp transistors 334 and 234, pnp diode drop transistors 380 and 280, and pnp diode level shift transistors 370 and 270.

Negative drive circuit 304 and negative drive circuit 204 correspond and have substantially equivalent components including respective npn output transistors 322 and 222, negative current mirror circuits 344 and 244, npn current sink transistors 330 and 230, npn common base bias transistors 328 and 228, npn current mirror transistors 338 and 238, and npn transistors 336 and 236.

The respective components of amplifier output stage 300 are interconnected essentially the same as corresponding components of amplifier output stage 200. However, in addition to the respective common components of amplifier output stages 300 and 200, negative drive circuit 304 of output stage 300 includes an npn diode level shift transistor 372 and a negative Darlington driver 308 which incorporates the npn output transistor 322, an npn current boost transistor 364 and a bias resistor 392. Npn output transistor 322 has an emitter connected to ground 316, a collector connected to the output terminal 314 and a base. Npn current boost transistor 364 has an emitter connected to the base of npn output transistor 322, a collector connected to power supply positive terminal 310 and a base. Bias resistor 392 is connected between ground 316 and a junction between the base of npn output transistor 322 and emitter of npn current boost transistor 364. Npn diode level shift transistor 372 has an emitter connected to a junction between the collector of npn current sink transistor 330 and emitter of npn common base bias transistor 328. Npn diode level shift transistor 372 has a collector and base which are interconnected and connected to the base of npn current boost transistor 364 and to the commonly connected collectors of pnp transistor 334 and pnp common base bias transistor 326 of positive drive circuit 302.

The output stage depicted in FIG. 3 includes two Darlington drivers 306 and 308, which respectively operate on the pnp and npn portions of the circuit. This embodiment is most useful for power op-amps in which it is desirable to drive the output as close to the positive and negative rails as possible. Power op-amps are to source and to sink current while maintaining a small quiescent current.

FIG. 4 illustrates an alternative embodiment of an amplifier output stage 400 which is comparable to amplifier output stage 300 shown in FIG. 3, but which is useful when the bias current of the Darlington driver 406 has a value that disallows incorporation of a resistor having a reasonable resistance R. Respective substantially equivalent components of amplifier output stages 400 and 300 include respective power supply positive terminals 410 and 310, grounds 416 and 316, input terminals 412 and 312, output terminals 414 and 314, pnp driver transistors 440 and 340, bias current sources 450 and 350 and bias current sinks 452 and 352. Positive drive circuit 402 and positive drive circuit 302 correspond and have substantially equivalent components including respective positive Darlington drivers 406 and 306, pnp output transistors 420 and 320, pnp current boost transistors 462 and 362, positive current mirror circuits 442 and 342, pnp constant current source transistors 424 and 324, pnp common base bias transistors 426 and 326, pnp current mirror transistors 432 and 332, pnp transistors 434 and 334, pnp diode drop transistors 480 and 380, and pnp diode level shift transistors 470 and 370.

Negative drive circuit 404 and negative drive circuit 304 correspond and have substantially equivalent components including respective negative Darlington drivers 408 and 308 having npn output transistors 422 and 322, npn current boost transistors 464 and 364, negative current mirror circuits 444 and 344, npn current sink transistors 430 and 330, npn common base bias transistors 428 and 328, npn current mirror transistors 438 and 338, npn transistors 436 and 336, and npn diode level shift transistors 472 and 372.

The respective components of amplifier output stage 400 are interconnected essentially the same as corresponding components of amplifier output stage 300. However, in the positive Darlington driver 406 of output stage 400, pnp bias transistor 460 replaces bias resistor 390 of the positive Darlington driver 306 of output stage 300. Also, in the negative Darlington driver 408 of output stage 400, npn bias transistor 466 replaces bias resistor 392 of the negative Darlington driver 308 of output stage 300.

FIG. 5 illustrates an alternative embodiment of an amplifier output stage 500 which is comparable to amplifier output stage 400 shown in FIG. 4. Respective substantially equivalent components of amplifier output stages 500 and 400 include respective power supply positive terminals 510 and 410, grounds 516 and 416, input terminals 512 and 412, output terminals 514 and 414, bias current sources 550 and 450 and bias current sinks 552 and 452. Positive drive circuit 502 and positive drive circuit 402 correspond and have substantially equivalent components including respective positive Darlington drivers 506 and 406, pnp output transistors 520 and 420, pnp current boost transistors 562 and 462 and pnp bias transistors 560 and 460. Negative drive circuit 504 and negative drive circuit 404 correspond and have substantially equivalent components including respective negative Darlington drivers 508 and 408 having npn output transistors 522 and 422, npn current boost transistors 564 and 464, and npn bias transistors 566 and 466.

The respective components of amplifier output stage 500 are interconnected essentially the same as corresponding components of amplifier output stage 400. However, npn driver transistor 540 replaces pnp driver transistor 440. Npn driver transistor 540 has an emitter connected to the base of npn current boost transistor 564, a collector connected to the positive power supply terminal 510 and a base connected to the signal input terminal 512. Furthermore, positive current mirror circuit 542 and negative current mirror circuit 544 of output stage 500 are respectively dissimilar in comparison to positive current mirror circuit 442 and negative current mirror circuit 444 of output stage 400. Positive current mirror circuit 542 incorporates a pnp constant current source transistor 524, a pnp common base bias transistor 526, a pnp current mirror transistor 532, a pnp transistor 534 and a pnp diode drop transistor 580. The series connection of pnp current mirror transistor 532, pnp transistor 534 and pnp diode drop transistor 580 develop a potential about three $V_{BE}$ below the voltage of power supply positive terminal 510 to furnish a source of bias voltage to the base of the Darlington driver 506.

Pnp constant current source transistor 524 has an emitter connected to power supply positive terminal 510, a collector connected to the base of pnp current boost transistor 562 and a base connected to the base of pnp bias transistor 560. Pnp common base bias transistor 526 is connected in series with pnp constant current source transistor 524 and has an emitter connected to the collector of pnp constant current source transistor 524, a collector connected to npn current boost transistor 564. Pnp current mirror transistor 532 has an emitter connected to power supply positive terminal 510 and a collector and base which are interconnected and connected to the base of pnp constant current source transistor 524. Pnp diode drop transistor 580 is connected in series with pnp current mirror transistor 532 and has an emitter connected to the collector and base of pnp current mirror transistor 532 and a collector and a base which are interconnected. Pnp transistor 534 has an emitter connected the base and collector of pnp diode drop transistor 580 and a collector and base which are interconnected and connected to the base of pnp common base bias transistor 526 and to bias current sink 552.

Negative current mirror circuit 544 incorporates an npn current sink transistor 530, an npn common base bias transistor 528, an npn current mirror transistor 538, an npn transistor 536 and an npn diode drop transistor 582. Npn current sink transistor 530 has an emitter connected to ground 516, a collector connected to the base of npn current boost transistor 564 and a base connected to the base of npn bias transistor 566. Npn common base bias transistor 528 is connected in series with npn current sink transistor 530 and has an emitter connected to the collector of npn current sink transistor 530, a collector connected to the base of pnp current boost transistor 562. Npn current mirror transistor 538 has an emitter connected to ground 516 and a collector and base which are interconnected and connected to the base of npn current sink transistor 530. Npn diode drop transistor 582 is connected in series with npn current mirror transistor 538 and has an emitter connected to the collector and base of npn current mirror transistor 538 a collector and a base which are interconnected. Npn transistor 536 has an emitter connected the base and collector of npn diode drop transistor 582 and a collector and base which are interconnected and connected to the base of npn common base bias transistor 528 and to bias current source 550. The series connection of npn current mirror transistor 538, npn transistor 536 and npn diode drop transistor 582 develop a potential about three $V_{BE}$ above ground 516 to supply a source of bias voltage to the base of the negative Darlington driver 508, causing the output stage to utilize a minimum power supply voltage of $4V_{BE}+V_{CE(SAT)}$. Thus an op-amp utilizing the output stage illustrated in FIG. 5 cannot furnish a voltage swing as close to the positive and negative power supply rails as the output stages shown in FIGS. 2, 3 and 4.

Figure 6:
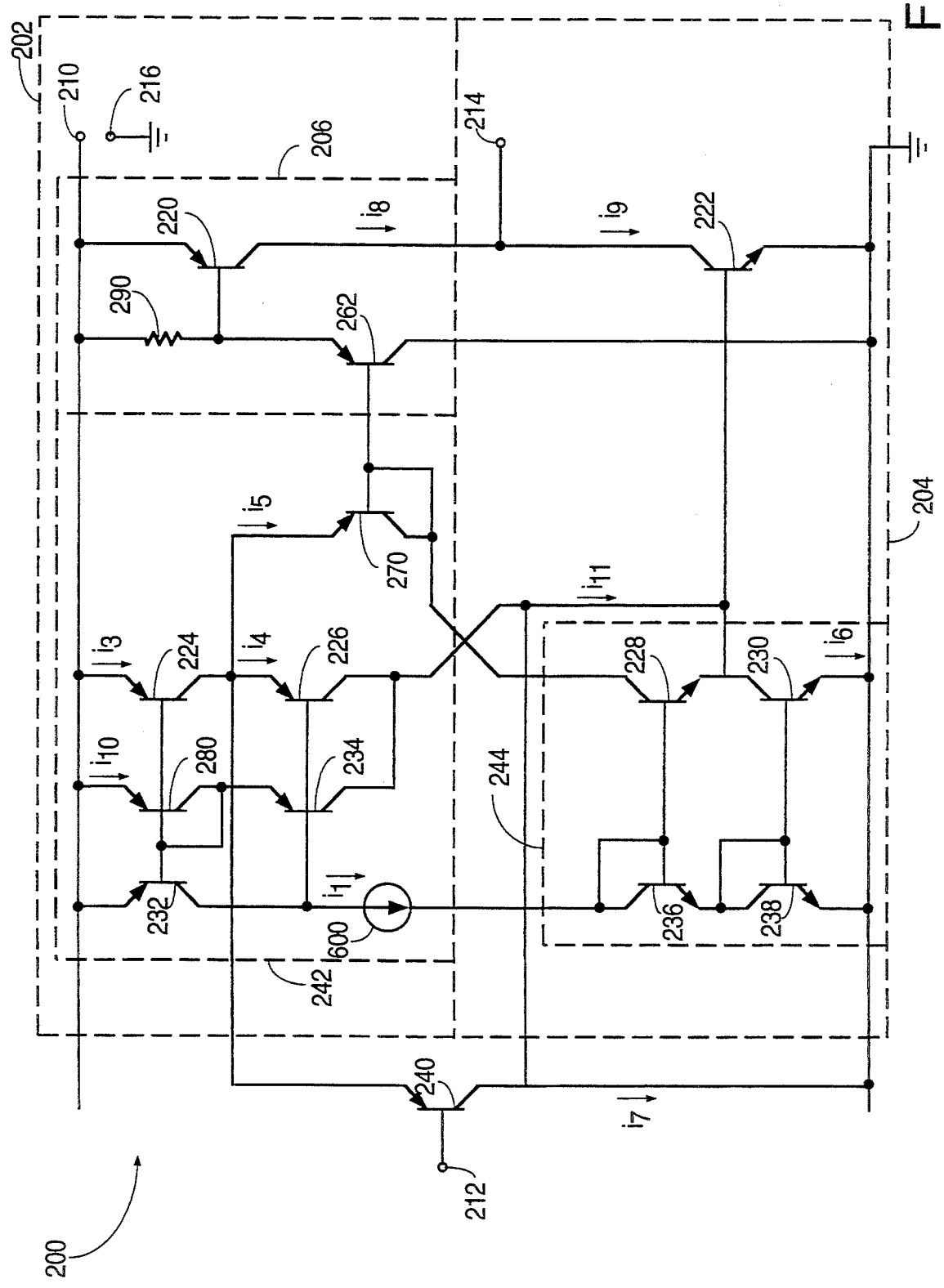
FIG. 6 is a bipolar transistor schematic circuit diagram of a class AB output stage utilizing an improved mirror circuit and a Darlington output driver using a floating current source.

FIG. 6 depicts an embodiment of the output stage 200 of FIG. 2, which uses a single floating current source 600 in place of the constant current source 250 and the constant current sink 252. Floating current source 600 is connected between the collector of pnp current mirror transistor 232 and the collector of npn transistor 236.

Figure 7A:
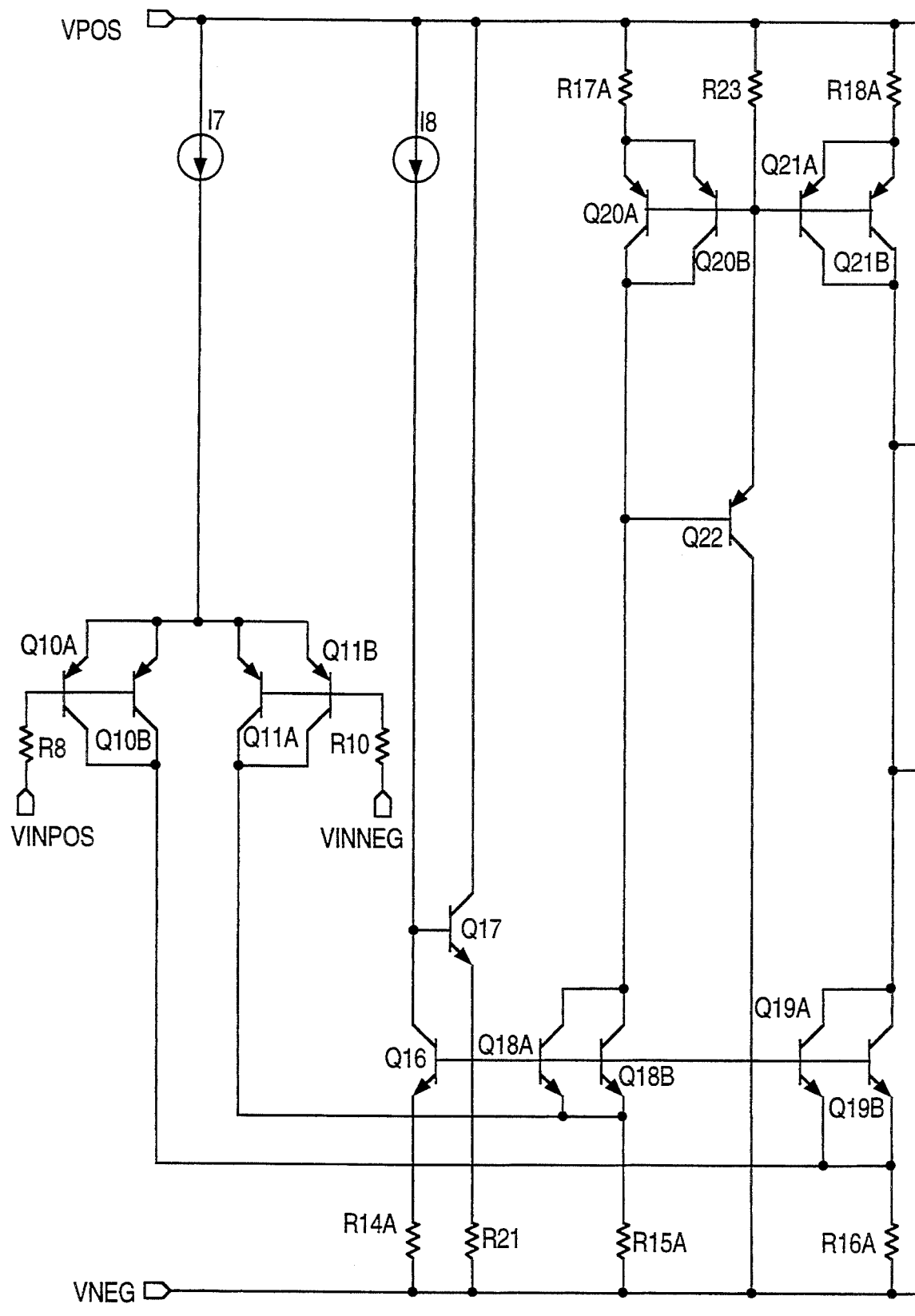
FIG. 7 depicts a schematic circuit diagram of an operational amplifier that incorporates an embodiment of the output stage.
Figure 7B:
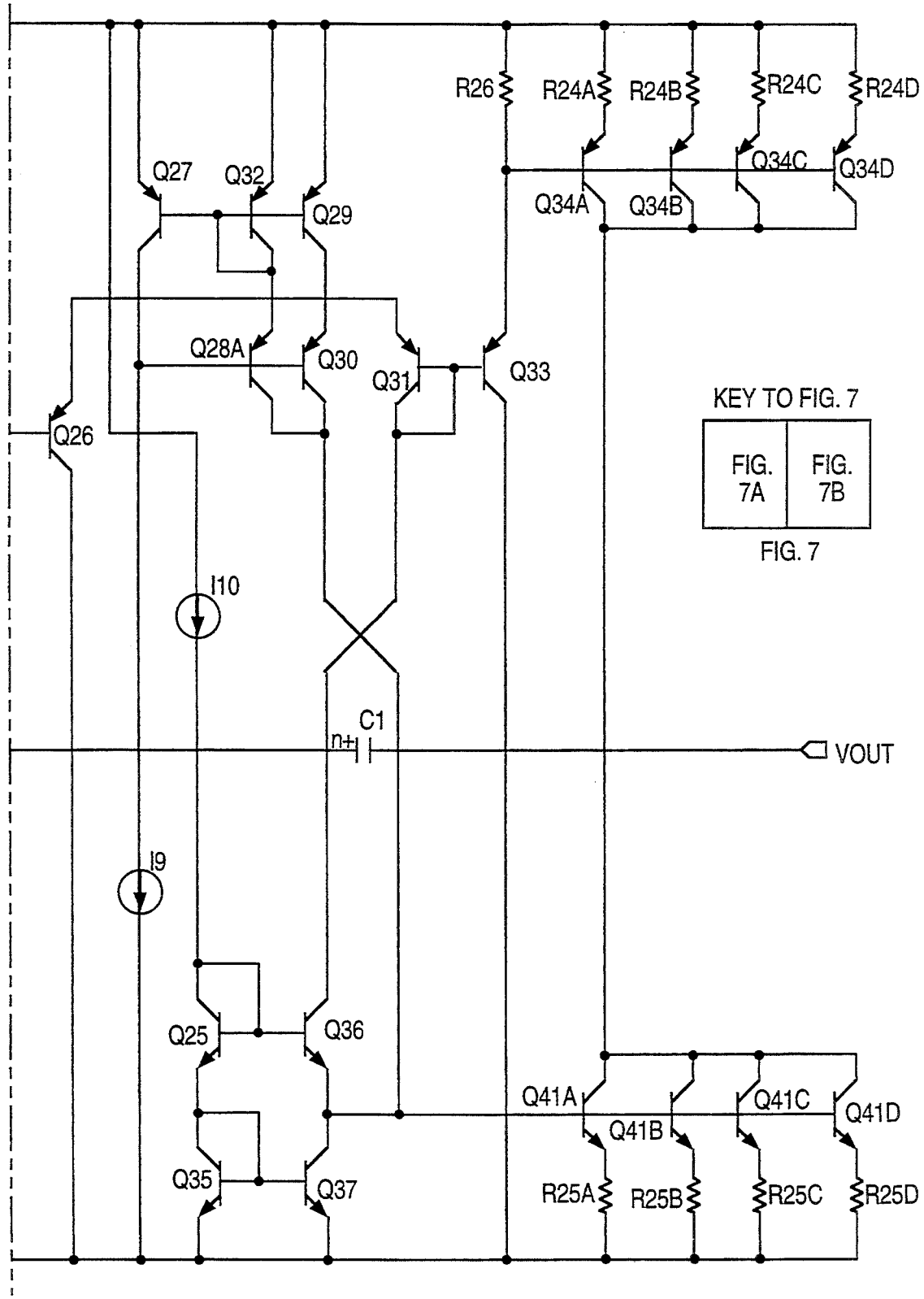
Figure 2:
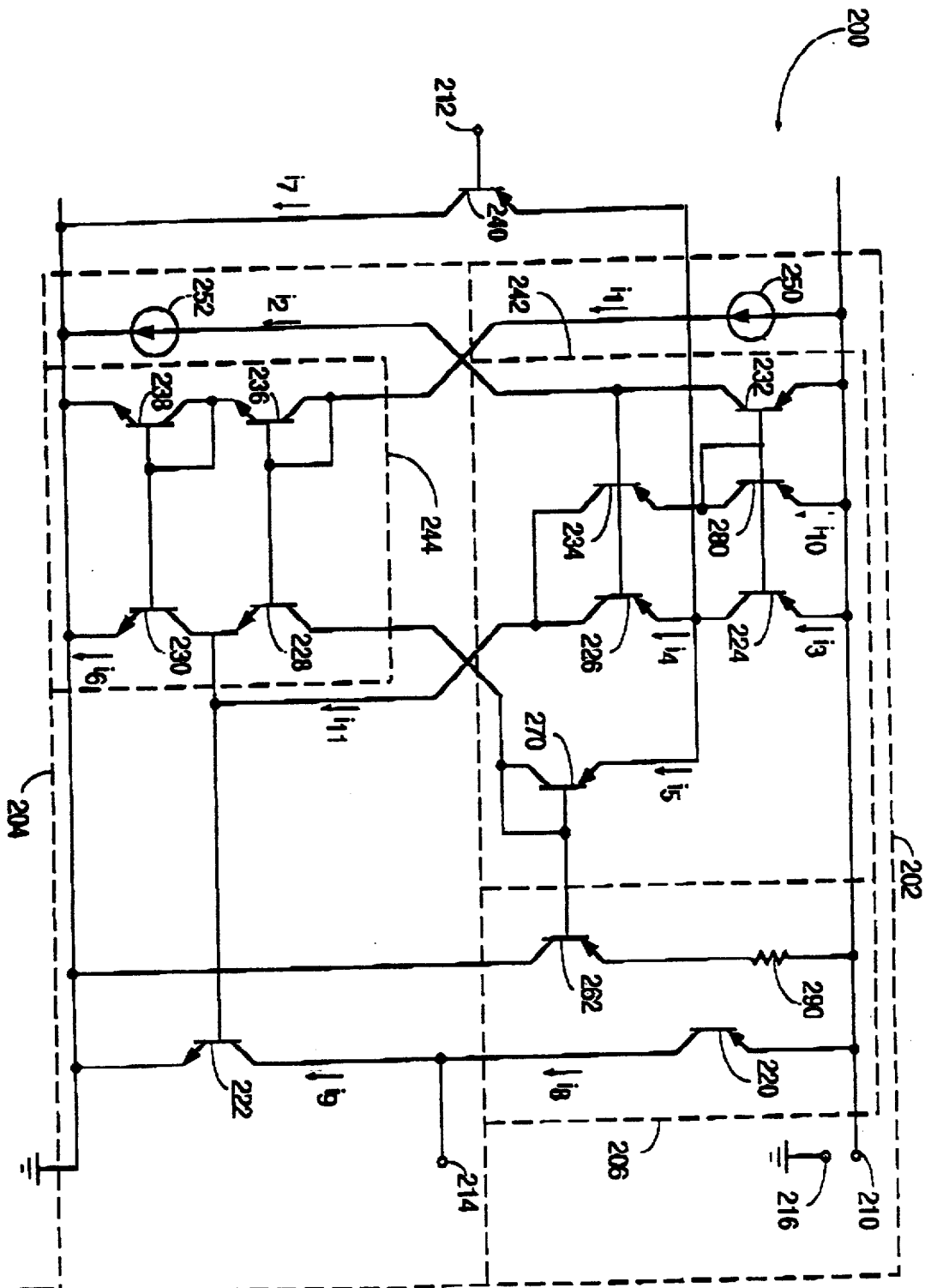
Figure 3:
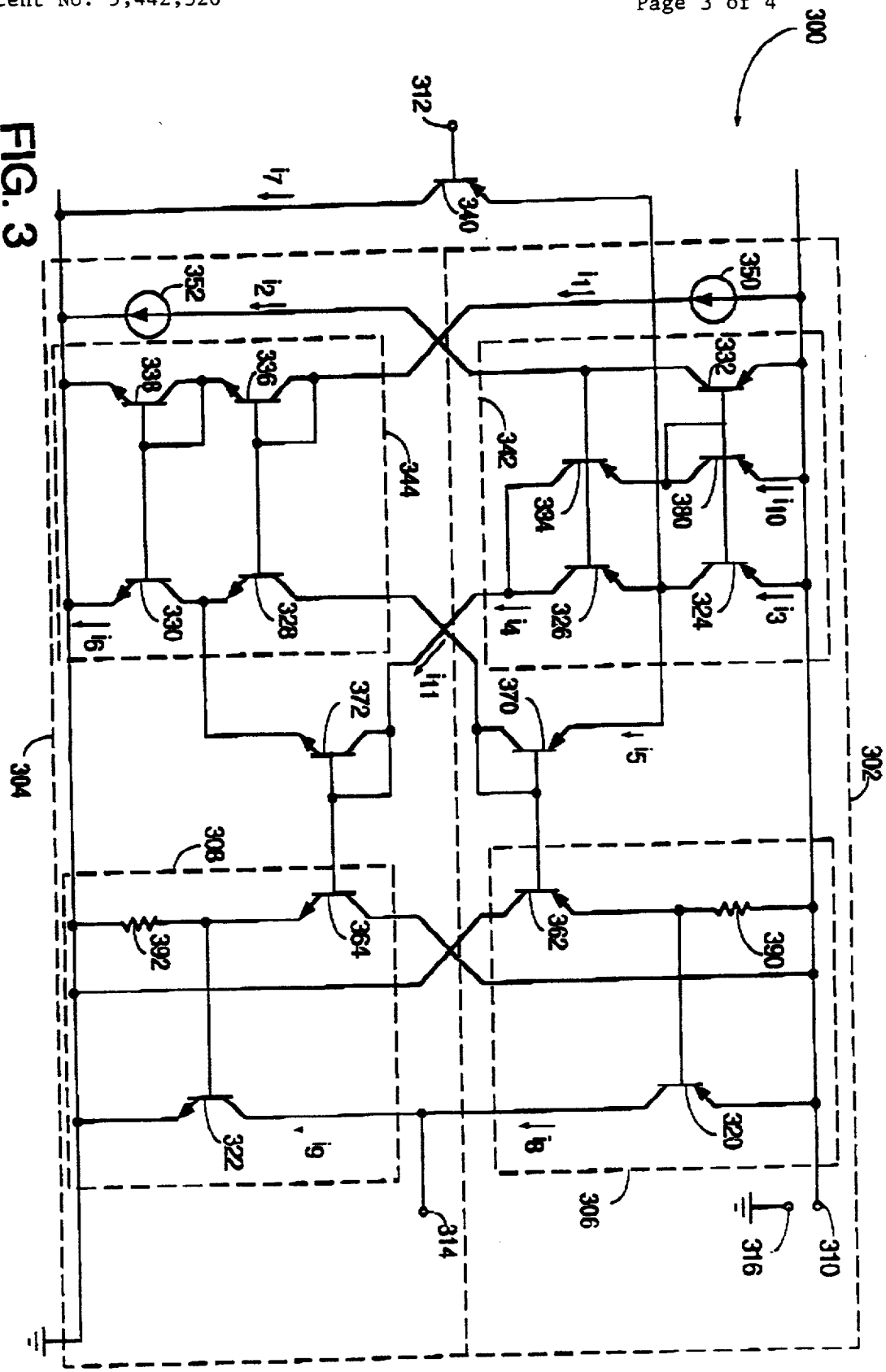
Figure 4:
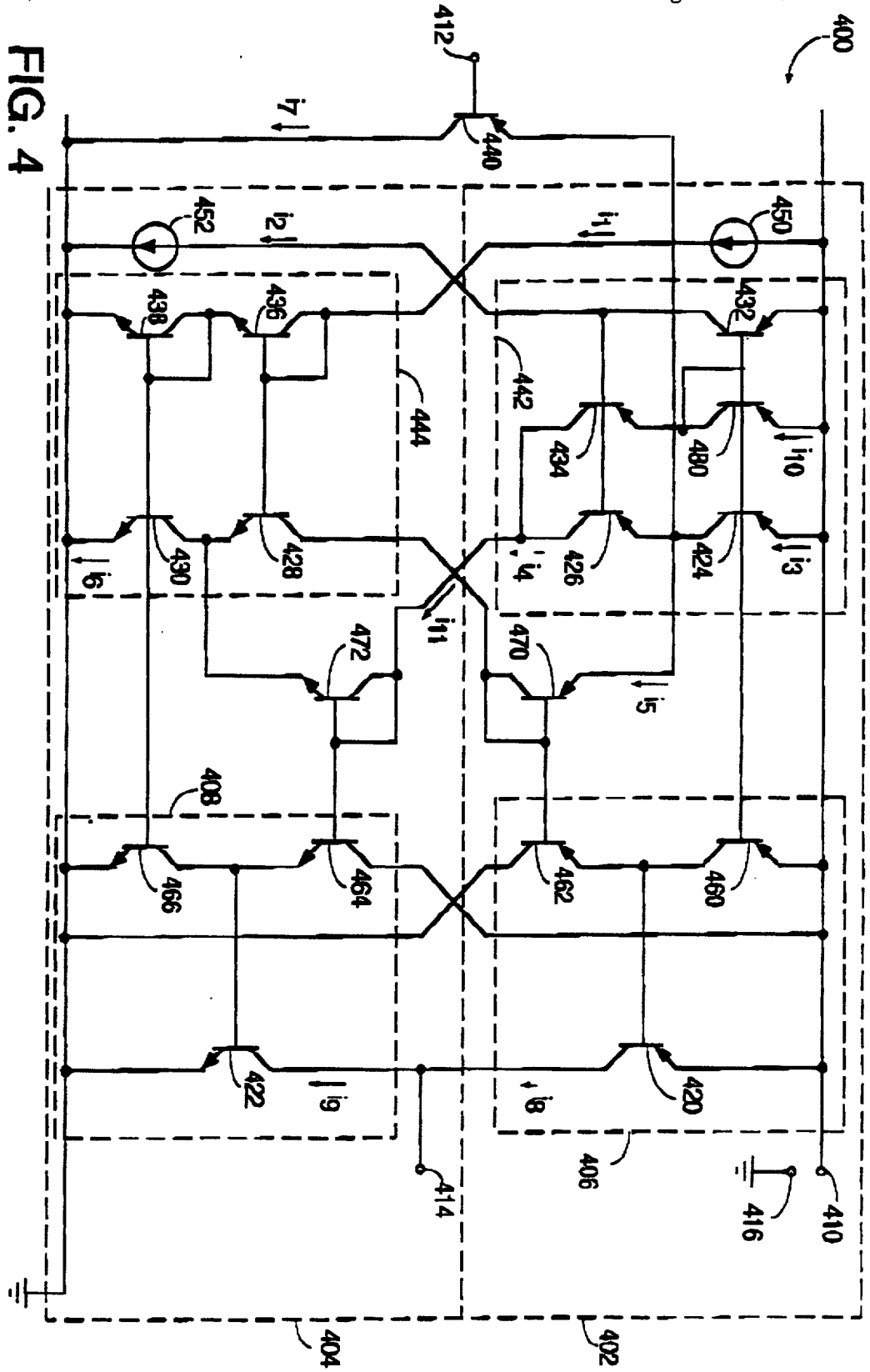

Referring to FIG. 7, an op-amp utilizing an output stage in accordance with the described embodiments is shown in combination with an input stage. The input stage includes a first pair of transistors Q10A and Q10B and a second pair of transistors Q11A and Q11B which form a differential pnp input stage. The input stage drives a folded cascode npn mirror which includes transistors Q18A, Q18B, Q19A and Q19B, and resistors R15A and R16A. The input stage is actively loaded with the pnp mirror formed by transistors Q20A, Q20B, Q21A, Q21B and Q22, and resistors R17A, R18A and R23. Emitter follower transistor Q26 buffers the output stage for high open-loop gain while driving heavy loads.

A complementary common-emitter output stage supplies a wide output voltage swing. A mirrored current source is formed by pnp transistors Q34A, Q34B, Q34C and Q34D. A mirrored current sink is supplied by npn transistors Q41A, Q41B, Q41C and Q41D. Emitter follower transistor Q33 drives the Q34 current source. Transistor Q33 is driven by transistor Q26 through level shift transistor Q31. Transistors Q30 and Q36 operate as common-base amplifiers which control the drive to output transistors Q34A, Q34B, Q34C and Q34D and Q41A, Q41B, Q41C and Q41D respectively. When the op-amp sources current, the collector current of transistor Q29 is diverted away from transistor Q30 and into transistor Q26. The collector current of transistor of transistor Q37 is steered through transistor Q36, which drives transistors Q33 and Q34 harder. Diode Q31 furnishes level shifting for transistor Q33. When the op-amp sinks current, the collector current of transistor Q29 is redirected from transistor Q26 to transistor Q30, which drives output transistor Q41 harder. The pnp mirror formed by transistors Q27, Q28A, Q28B, Q29, Q30 and Q32 minimizes the output stage sensitivity to $\beta_{pnp}$, thereby reducing the reflection of offset errors back to the input stage. Base current in the mirrors is directed to the output transistor Q41A, Q41B, Q41C and Q41D to boost output sink capability.

Various other embodiments and modifications and improvements not described herein may be within the spirit and scope of the present invention, as defined by the following claims.

We claim:

1. A complementary transistor class AB output stage having a signal input terminal, a signal output terminal, a first reference power supply terminal and a second reference power supply terminal, the output stage comprising:

a Darlington output driver having an emitter terminal coupled to the first reference power supply terminal, a first collector terminal coupled to the second reference supply terminal, a second collector terminal coupled to the signal output terminal and a base terminal;

a complementary output driver complementary to the Darlington output driver having an emitter terminal coupled to the second reference power supply terminal, a collector terminal coupled to the signal output terminal and a base terminal;

a bias transistor having an emitter coupled to the Darlington output driver base terminal, a collector coupled to the complementary output driver base terminal, and a base coupled to a source of bias voltage operated at a potential between the potentials of the first and second reference power supply terminals about two $V_{BE}$ from the potential of the first reference power supply terminal;

a complementary bias transistor complementary to the bias transistor having an emitter coupled to the complementary output driver base terminal, a collector coupled to the Darlington output driver base terminal, and a base coupled to a source of bias voltage operated at a potential between the potentials of the first and second reference power supply terminals about two $V_{BE}$ from the potential of the second reference power supply terminal;

a constant current source coupled between the first reference power supply terminal and the Darlington output driver base terminal;

a complementary constant current source complementary to the constant current source coupled between the second reference power supply terminal and the complementary output driver base terminal; and a driver applying a signal from the signal input terminal to the base of one of the output drivers.

2. The output stage of claim 1 wherein the constant current source comprises:

a constant current source transistor having an emitter coupled to the first reference power supply terminal, a collector coupled to the emitter of the bias transistor and a base; and a mirror current source transistor having an emitter coupled to the first reference power supply terminal, a collector coupled to the second reference power supply terminal through a complementary current source generator;

the constant current source transistor forming a first current mirror with the mirror current source transistor and the first current mirror forming a second current mirror with the Darlington output driver.

3. The output stage of claim 2 wherein a first diode drop transistor having an emitter coupled to the first reference power supply terminal, a directly coupled collector and base also being coupled to the base of the constant current source transistor, is coupled in series with a second diode drop transistor having an emitter coupled to the collector of the first diode drop transistor, a base coupled to the base of the bias transistor and a collector coupled to the collector of the bias transistor to develop the potential about two $V_{BE}$ from the potential of the first reference power supply terminal.

4. The output stage of claim 1 further comprising:

a level shift transistor having an emitter coupled to the emitter of the bias transistor, a base and collector that are directly coupled and also coupled to the base terminal of the Darlington output driver and to the collector of the complementary bias transistor.

5. The output stage of claim 1 wherein the Darlington output driver comprises:

an output transistor having an emitter coupled to the first reference power supply terminal, a collector coupled through the second collector terminal to the signal output terminal and a base;

a Darlington input transistor having an emitter coupled to a bias element, a collector coupled through the first collector terminal to the second reference power supply terminal and base coupled to the base terminal; and the bias element being coupled between the Darlington input transistor emitter and the first reference power supply terminal via the emitter terminal.

6. The output stage of claim 5 wherein the bias element of the Darlington output driver is a transistor having an emitter coupled to the first reference power supply terminal via the emitter terminal and a collector coupled to the Darlington input transistor emitter.

7. The output stage of claim 5 wherein the bias element of the Darlington output driver is a resistor having a resistance R and the bias current is approximately $V_{BE}/R$.

8. The output stage of claim 1 wherein:

the transistors of the Darlington output driver, the bias transistor, the constant current source, and the driver are bipolar pnp transistors; and the transistors of the complementary output driver, the complementary bias transistor, and the complementary constant current source are bipolar npn transistors.

9. The output stage of claim 1 wherein the driver is a bipolar emitter follower transistor stage.

10. The output stage of claim 1 wherein the driver is a bipolar emitter follower transistor having an emitter coupled to the base terminal of the Darlington output driver, a collector coupled to the second reference power supply terminal, and a base coupled to the signal input terminal.

11. The output stage of claim 1 further comprising:

a level shift transistor having an emitter coupled to the emitter of the bias transistor, a base and collector that are directly coupled and also coupled to the base terminal of the Darlington output driver and to the collector of the complementary bias transistor, wherein the driver is a bipolar emitter follower transistor having an emitter coupled the emitter of the level shift transistor, a collector coupled to the second reference power supply terminal, and a base coupled to the signal input terminal.

12. The output stage of claim 1, wherein the complementary output driver is a transistor having an emitter coupled to the second reference power supply terminal, a collector coupled to the signal output terminal and a base terminal coupled to the complementary bias transistor emitter.

13. The output stage of claim 12 wherein the complementary constant current source comprises:

a complementary constant current source transistor having an emitter coupled to the second reference power supply terminal, a collector coupled to the emitter of the complementary bias transistor and a base; and a complementary mirror current source transistor having an emitter coupled to the second reference power supply terminal, a collector and base that are directly coupled and also coupled to the base of the constant current source transistor;

the complementary constant current source transistor forming a first current mirror with the complementary mirror current source transistor and the first current mirror forming a second current mirror with the complementary output driver.

14. The output stage of claim 13 wherein a diode drop transistor having an emitter coupled to the collector of the complementary mirror current source transistor, a directly coupled collector and base also being coupled to the base of the complementary bias transistor base is coupled in series with the complementary mirror current source transistor to develop the potential about two $V_{BE}$ from the potential of the second reference power supply terminal.

15. The output stage of claim 1 wherein the complementary output driver is an output driver in a complementary Darlington configuration comprising:

an output transistor having an emitter coupled to the second reference power supply terminal and a collector coupled to the signal output terminal;

a Darlington input transistor having an emitter coupled to a bias element and a collector coupled to the first reference power supply terminal; and the bias element being coupled between the Darlington input transistor emitter and the second reference power supply terminal.

16. The output stage of claim 15 wherein the bias element of the complementary output driver is a transistor having an emitter coupled to the second reference power supply terminal and a collector coupled to the Darlington input transistor emitter.

17. The output stage of claim 15 wherein the bias element of the complementary output driver is a resistor having a resistance R and the bias current is approximately $V_{BE}/R$.

18. A complementary transistor class AB output stage having a signal input terminal, a signal output terminal, a positive power supply terminal and a negative power supply terminal, the output stage comprising:

a Darlington output driver;

a complementary output transistor complementary to the Darlington output driver coupled in series with the Darlington output driver between the positive and negative power supply terminals;

a complementary current source coupled to drive the output of the complementary output transistor; and a current mirror circuit coupled to the Darlington output driver including:

a current mirror transistor coupled between the positive and negative power supply terminals in series with a constant current generator, a current source transistor forming a first current mirror with the current mirror transistor, the first current mirror forming a second current mirror with the Darlington output driver, a bias transistor coupled to the Darlington output driver and coupled in series with the current source transistor, a bias voltage source coupled in parallel with the coupled current source transistor and bias transistor operated at a potential about two $V_{BE}$ below the potential of the positive power supply terminal and coupling the bases of the current mirror circuit transistors to the base of the complementary output transistor to furnish additional current drive.

19. The output stage of claim 18 wherein the Darlington output driver comprises:

an output transistor having an emitter coupled to the positive power supply terminal and a collector coupled to the signal output terminal;

a Darlington input transistor having an emitter coupled to a bias element and a collector coupled to the negative power supply terminal; and the bias element being coupled between the Darlington input transistor emitter and the positive power supply terminal.

20. The output stage of claim 19 wherein the bias element of the Darlington output driver is a transistor having an emitter coupled to the positive power supply terminal and a collector coupled to the Darlington input transistor emitter.

21. The output stage of claim 19 wherein the bias element of the Darlington output driver is a resistor having a resistance R and the bias current is approximately $V_{BE}/R$.

22. The output stage of claim 18 wherein:

the transistors of the Darlington output driver and the current mirror circuit are bipolar pnp transistors; and the complementary output transistor and the transistors of the complementary current source are bipolar npn transistors.

23. The output stage of claim 18 further comprising: a level shift transistor coupling the current mirror circuit to the Darlington output driver.

24. A complementary transistor class AB output stage having a signal input terminal, a signal output terminal, a positive power supply terminal and a negative power supply terminal, the output stage comprising:

a Darlington output driver including:

an pnp output transistor having an emitter coupled to the positive power supply terminal, a collector coupled to the signal output terminal and a base, an pnp transistor having an emitter coupled to the base of the pnp output transistor, a collector coupled to the negative power supply terminal and a base; and a bias resistor coupled between the emitter of the pnp transistor and the positive power supply terminal;

an npn output transistor having an emitter coupled to the negative power supply terminal, a collector coupled to the signal output terminal, and a base;

a current mirror including:

a current source transistor having an emitter coupled to the positive power supply terminal, a collector and a base, a bias transistor having an emitter coupled to the collector of the current source transistor, a collector and a base, a first diode drop transistor having an emitter coupled to the positive power supply terminal, a base and collector that are directly coupled and also coupled to the base of the current source transistor, a second diode drop transistor having an emitter coupled to the collector of the first diode drop transistor, a collector coupled to the collector of the bias transistor, and a base coupled to the base of the bias transistor, and a current mirror transistor having an emitter coupled to the positive power supply terminal, a base coupled to the base of the first diode drop transistor and a collector coupled to the base of the second diode drop transistor and also coupled to a current sink;

a level shift transistor having an emitter coupled to the collector of the current mirror current source transistor, a collector and base that are directly coupled and also coupled to the base of the Darlington output driver pnp transistor;

a complementary current mirror including:

an npn current sink transistor having an emitter coupled to the negative power supply terminal, a collector, and a base, an npn bias transistor having an emitter coupled to the collector of the npn current sink transistor, a collector coupled to the collector of the level shift transistor, and a base, an npn current mirror transistor having an emitter coupled to the negative power supply terminal, a collector and base that are directly coupled and also coupled to the base of the npn current sink transistor, an npn diode drop transistor having an emitter coupled to the collector of the npn current mirror transistor, a base and collector that are directly coupled and also coupled to the base of the npn bias transistor and also coupled to a constant current source;

an pnp emitter follower transistor having an emitter coupled to the emitter of the level shift transistor, a collector coupled to the negative power supply terminal, and a base coupled to the signal input terminal.

25. A complementary transistor class AB output stage having a signal input terminal, a signal output terminal, a positive power supply terminal and a negative power supply terminal, the output stage comprising:

a first Darlington output driver;

a second Darlington output driver complementary to and coupled in series with the first Darlington output driver between the positive and negative power supply terminals;

a complementary current source coupled to drive the output of the second Darlington output driver; and a current mirror circuit coupled to the first Darlington output driver including:

a current mirror transistor coupled between the positive and negative power supply terminals in series with a constant current generator, a current source transistor forming a first current mirror with the current mirror transistor, the first current mirror forming a second current mirror with the first Darlington output driver, a bias transistor coupled to the first Darlington output driver and coupled in series with the current source transistor, a bias voltage source coupled in parallel with the coupled current source transistor and bias transistor operated at a potential about two $V_{BE}$ below the potential of the positive power supply terminal and furnishing additional current drive.

26. The output stage of claim 25 wherein the first Darlington output driver comprises:

an output transistor having an emitter coupled to the positive power supply terminal and a collector coupled to the signal output terminal;

a Darlington input transistor having an emitter coupled to a bias element and a collector coupled to the negative power supply terminal; and the bias element being coupled between the Darlington input transistor emitter and the positive power supply terminal.

27. The output stage of claim 26 wherein the bias element of the first Darlington output driver is a transistor having an emitter coupled to the positive power supply terminal and a collector coupled to the first Darlington input transistor emitter.

28. The output stage of claim 26 wherein the bias element of the first Darlington output driver is a resistor having a resistance R and the bias current is approximately $V_{BE}/R$.

29. The output stage of claim 25 wherein:
the transistors of the first Darlington output driver and the current mirror circuit are bipolar pnp transistors; and
the transistors of the second Darlington output driver and the complementary current source are bipolar npn transistors.

30. A complementary transistor class AB output stage having a signal input terminal, a signal output terminal, a positive power supply terminal and a negative power supply terminal, the output stage comprising:
a first Darlington output driver;
a second Darlington output driver complementary to and coupled in series with the first Darlington output driver between the positive and negative power supply terminals;
a first current mirror circuit coupled to the first Darlington output driver including:
a first current mirror transistor,
a first constant current source transistor forming a first current mirror with the current mirror transistor, the first current mirror forming a second current mirror with the first Darlington output driver,
a first bias transistor coupled to the first Darlington output driver and coupled in series with the first constant current source transistor and having a base coupled to a source of bias voltage operated at about three $V_{BE}$ below the positive power supply terminal,
a first diode drop transistor having its collector directly coupled to its base,
a second diode drop transistor having its collector directly coupled to its base, the first current mirror transistor and the first and second diode drop transistors being coupled in series to develop the potential about three $V_{BE}$ below the positive power supply terminal; and
a second current mirror circuit coupled to the second Darlington output driver including:
a second current mirror transistor,
a second constant current source transistor forming a third current mirror with the current mirror transistor, the third current mirror forming a fourth current mirror with the second Darlington output driver,
a second bias transistor coupled to the second Darlington output driver and coupled in series with the second constant current source transistor and having a base coupled to a source of bias voltage operated at about three $V_{BE}$ above the negative power supply terminal,
a third diode drop transistor having its collector directly coupled to its base,
a fourth diode drop transistor having its collector directly coupled to its base, the second current mirror transistor and the third and fourth diode drop transistors being coupled in series to develop the potential about three $V_{BE}$ above the negative power supply terminal.

31. The output stage of claim 30 wherein the first Darlington output driver comprises:
an output transistor having an emitter coupled to the positive power supply terminal and a collector coupled to the signal output terminal;
a Darlington input transistor having an emitter coupled to a bias element and a collector coupled to the negative power supply terminal; and
the bias element being coupled between the Darlington input transistor emitter and the positive power supply terminal.

32. The output stage of claim 31 wherein the bias element of the first Darlington output driver is a transistor having an emitter coupled to the positive power supply terminal and a collector coupled to the first Darlington input transistor emitter.

33. The output stage of claim 31 wherein the bias element of the first Darlington output driver is a resistor having a resistance R and the bias current is approximately $V_{BE}/R$.

34. The output stage of claim 30 wherein the second Darlington output driver comprises:
an output transistor having an emitter coupled to the negative power supply terminal and a collector coupled to the signal output terminal;
a Darlington input transistor having an emitter coupled to a bias element and a collector coupled to the positive power supply terminal; and
the bias element being coupled between the Darlington input transistor emitter and the negative power supply terminal.

35. The output stage of claim 34 wherein the bias element of the second Darlington output driver is a transistor having an emitter coupled to the negative power supply terminal and a collector coupled to the second Darlington input transistor emitter.

36. The output stage of claim 34 wherein the bias element of the second Darlington output driver is a resistor having a resistance R and the bias current is approximately $V_{BE}/R$.

37. The output stage of claim 30 wherein:
the transistors of the first Darlington output driver and the first current mirror circuit are bipolar pnp transistors; and
the transistors of the second Darlington output driver and the second current mirror circuit are bipolar npn transistors.

* * * * *

UNITED STATES PATENT AND TRADEMARK OFFICE
CERTIFICATE OF CORRECTION

PATENT NO. : 5,442,320
DATED : August 15, 1995
INVENTOR(S) : David J. Kunst and Stuart B. Shacter It is certified that error appears in the above-identified patent and that said Letters Patent is hereby corrected as shown below:

Please substitute the previously issued Figure 2 (sheet 2 of 8) for the attached corrected Figure 2 (sheet 2 of 8)

Please substitute the previously issued Figure 3 (sheet 3 of 8) for the attached corrected Figure 3 (sheet 3 of 8)

Please substitute the previously issued Figure 4 (sheet 4 of 8) for the attached corrected Figure 4 (sheet 4 of 8)

Please substitute the previously issued Figure 6 (sheet 6 of 8) for the attached corrected Figure 6 (sheet 6 of 8)

Signed and Sealed this

Twenty-eighth Day of January, 1997

Attest:

BRUCE LEHMAN

*Attesting Officer*     *Commissioner of Patents and Trademarks*